(12) United States Patent
St. Pierre et al.

(10) Patent No.: US 7,053,612 B2
(45) Date of Patent: May 30, 2006

(54) METHOD OF ESTIMATING THE SPATIAL VARIATION OF MAGNETIC RESONANCE IMAGING RADIOFREQUENCY (RF) SIGNAL INTENSITIES WITHIN AN OBJECT FROM THE MEASURED INTENSITIES IN A UNIFORM SPIN DENSITY MEDIUM SURROUNDING THE OBJECT

(75) Inventors: Tim St. Pierre, Crawley (AU); Paul Clark, Brentwood (AU)

(73) Assignee: Inner Vision Biometrics Pty Ltd., Nedlands (AU)

( * ) Notice: Subject to any disclaimer, the term of this patent is extended or adjusted under 35 U.S.C. 154(b) by 71 days.

(21) Appl. No.: 10/820,727

(22) Filed: Apr. 9, 2004

(65) Prior Publication Data

US 2004/0222792 A1 Nov. 11, 2004

(30) Foreign Application Priority Data

Apr. 9, 2003 (AU) .............................. 2003901659

(51) Int. Cl.
*G01V 3/00* (2006.01)

(52) U.S. Cl. ..................................................... 324/307

(58) Field of Classification Search ......... 324/300–322
See application file for complete search history.

(56) References Cited

U.S. PATENT DOCUMENTS

| | | | |
|---|---|---|---|
| 5,509,412 A * | 4/1996 | Bahn | 600/419 |
| 6,445,183 B1 | 9/2002 | Shimizu et al. | |
| 6,453,187 B1 | 9/2002 | Prince et al. | |
| 6,545,472 B1 | 4/2003 | Prussmann et al. | |
| 6,546,274 B1 * | 4/2003 | Itagaki et al. | 600/413 |
| 2001/0018559 A1 * | 8/2001 | Itagaki et al. | 600/413 |

FOREIGN PATENT DOCUMENTS

EP 0208 522 B1 2/1990

OTHER PUBLICATIONS

Sled, J.G., et al.; "Standing-Wave and RF Penetration Artifacts Caused by Elliptic Geometry: An Electrodynamic Analysis of MRI"; IEEE Transactions on Medical Imaging; vol. 17, No. 4, 1998; pp. 653-662.

(Continued)

*Primary Examiner*—Diego Gutierrez
*Assistant Examiner*—Dixomara Vargas
(74) *Attorney, Agent, or Firm*—Edell, Shapiro & Finnan, LLC

(57) ABSTRACT

A method of estimating the spatial variation in RF signal intensity within magnetic resonance images of an object is described. The estimate can be used to provide enhanced contrast in a magnetic resonance image by correcting for spatial variation in RF intensities arising from non-uniformities in RF receiving coils of an MRI machine acquiring the image as well as distortions arising from the object and observation itself. This is achieved through compound imaging of a medium of essentially uniform spin density surrounding the object. From analysis of the surrounding medium, and the location of notional points of RF signal reception, a semi-empirical mathematical formulation of the decay profile of the RF signal intensity within the object is determined. This is then fitted to selected signal intensities from the medium surrounding the object to obtain an estimate of the spatial variation in RF signal intensity within the object.

30 Claims, 10 Drawing Sheets

OTHER PUBLICATIONS

Zhou, L.G., et al.; "A Method of Radio-Frequency Inhomogeneity Correction for Brain Tissue Segmentation in MRI"; Computerized Medical Imaging and Graphics; vol. 25, Sep.-Oct. 2001; pp. 379-389.

Dawant, B.M., et al.; "Correction of Intensity Variations in MR Images for Computer-Aided Tissue Classification", IEEE Transactions on Medical Imaging; vol. 12, No. 4, Dec. 1993; pp. 770-781.

* cited by examiner

METHOD OF ESTIMATING THE SPATIAL VARIATION OF MAGNETIC RESONANCE IMAGING RADIOFREQUENCY (RF) SIGNAL INTENSITIES WITHIN AN OBJECT FROM THE MEASURED INTENSITIES IN A UNIFORM SPIN DENSITY MEDIUM SURROUNDING THE OBJECT

FIELD OF THE INVENTION

The present invention relates to a method of estimating the spatial variation of magnetic resonance imaging radiofrequency (RF) signal intensities within an object from the measured intensities in a uniform spin density medium surrounding the object, such as for the subcutaneous fat surrounding the liver in an axial image.

BACKGROUND OF THE INVENTION

The clinical applications of nuclear magnetic resonance imaging (MRI) are progressively expanding into the quantitative measurement of the physical and chemical properties and processes of the human body. Where quantitative information is extracted from the image data, it is important to account for the variety of instrumental effects that may perturb the parameter being measured, as well as any erroneous effects presented by the object being imaged. Of particular importance are the multiplicative inhomogeneities contributing to the spatial variation in radio frequency (RF) signal intensity within the image. Non-uniformities in magnetic resonance signal intensity are caused by both instrumental and object effects, as perceived by J. G. Sled and G. B. Pike, in "Standing-Wave and RF Penetration Artifacts Caused by Elliptic Geometry: An Electrodynamic Analysis of MRI", IEEE Transactions on Medical Imaging, Vol. 17, No. 4, pp. 653–662, 1998 (ref). Instrumental effects include inhomogeneous RF excitation, non-uniformities in receiving coil sensitivity, and gradient field eddy currents, whilst measurement object effects include variable RF penetration and standing wave effects.

These intensity variations are detrimental to the meaningful comparison of image intensities in separate parts of the image, and must be corrected for if accurate quantitative information is to be obtained. Methods that can correct for the effects of the RF signal intensity gradient are thus an important area of development in quantitative MRI.

A variety of pre- and post-processing techniques have been developed with the aim to correct for the spatial variation in RF signal intensity within the object being measured, as discussed by L. Q. Zhou, Y. M. Zhu, C. Bergot, A.-M. Laval-Jeantet, V. Bousson, J.-D. Laredo, and M. Laval-Jeantet, in "A method of radio-frequency inhomogeneity correction for brain tissue segmentation in MRI", Computerized Medical Imaging and Graphics, Vol. 25, pp. 379–389, 2001. Pre-processing techniques have focussed on the measurement of homogeneous phantoms prior to measurement of the object under study to estimate the inhomogeneities in the RF field. However, these techniques do not typically account for the inhomogeneities in RF penetration presented by the object being imaged. Post-processing techniques attempt to rectify this situation by estimating the decay profile of the RF signal intensity within the object from analysis of the object data set itself. This enables both correction of object independent effects, such as bias in the RF field, as well as object dependent effects, such as signal intensity attenuation within the object. The assumption behind most post-processing techniques is that the non-uniformity in RF signal intensity may be attributed to a low spatial frequency component throughout the image. A number of approaches to estimating RF inhomogeneities are thus based on intensity correction schemes that employ image smoothing. Homomorphic filters are predominantly used in this situation as they account for the low frequency signal intensity components without altering structural boundaries. Other post-processing methods are based on structural classification techniques and intensity surface interpolation.

One post-processing technique for the estimation of RF signal intensity variations within the human head is worth particular reference. The method by B. M. Dawant, A. P. Zijdenbos, and R. A. Margolin, in "Correction of Intensity Variations in MR Images for Computer-Aided Tissue Classification", IEEE Transactions on Medical Imaging, Vol. 12, No. 4, pp. 770–781, 1993, consists of interpolating a thin-plate spline surface to reference points within the white matter of the brain and to use the interpolated surface as an estimator of the RF coil profile. The availability of reference points on the periphery of the images is crucial for obtaining good correction surfaces, so intensity values of edge points are extrapolated from the interior reference points. To reduce the sensitivity of the technique to the mislabelling of reference points selected by the user, the number of reference points may be increased by a tissue classification technique. The thin-plate spline surface is then fitted to the reference points by the method of least-squares rather than by interpolation.

The main limitation of the intensity surface correction technique described above is that there is no measured data with which to justify the extrapolated intensity reference values at the periphery of the head, given that the signal intensity gradient is not known at these peripheral points. Further, there is no physical basis to the selection of the thin plate spline surface to model the RF signal intensity gradient. As such, the thin-plate spline surface may not adequately account for local variations in RF attenuation throughout the object being imaged.

It is to be understood that, if any prior art publication is referred to herein, such reference does not constitute an admission that the publication forms a part of the common general knowledge in the art, in Australia or any other country.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

SUMMARY OF THE INVENTION

It is an objective of the present invention to provide a method of estimating the spatial variation of magnetic resonance imaging radiofrequency (RF) signal intensities within an object from the measured intensities in a uniform spin density medium surrounding the object. Once the estimation has been obtained it may be used in a variety of ways to compensate for the spatial variation in RF signal intensity within the object or to simulate image intensities subject to the RF signal intensity variations.

According to the present invention there is provided a method of estimating the spatial variation of magnetic resonance imaging radio frequency (RF) signal intensities within an object from measured RF signal intensities of a uniform spin density medium surrounding the object, said method comprising:

acquiring a magnetic resonance image of an object bounded by a medium which is of essentially uniform spin density, on the length scale of resolution of the image;

formulating a semi-empirical mathematical model of the spatial variation in RF signal intensity within the said object; and, fitting said model to selected measured RF signal intensities of said surrounding medium to obtain an estimate of the spatial variation of magnetic resonance imaging radiofrequency (RF) signal intensities within said object.

Preferably said step of formulating said semi-empirical mathematical model of the spatial variation in RF signal intensity within the object comprises:

locating a plurality of points in a plane of said image which are notionally considered to act as apparent receivers of RF signals (hereinafter referred to as "RF receiver points"); and, formulating a spatial profile of RF signal intensity within said object in said plane of said image relative to the said RF receiver points.

Preferably said RF receiver points are located on said surrounding medium.

Preferably said spatial intensity profile is formulated in a manner which provides a concentric reduction in RF signal intensity with increasing distance from said RF receiver points.

Preferably said reduction in RF signal intensity is formulated as having the same rate of reduction in signal intensity with increasing distance from all said RF receiver points.

In one form of said model, said spatial profile is formulated as having an exponential reduction in signal intensity with increasing distance from said RF receiver points.

However in an alternate embodiment said spatial profile is formulated as having a reduction in signal intensity with the reciprocal of the distance from said RF receiver points raised to a chosen power.

Preferably said semi-empirical mathematical model is formulated as:

$$I(x, y) = \sum_{n=1}^{N} I_n e^{-R\sqrt{1/f \cdot (x-x_n)^2 + f \cdot (y-y_n)^2}}$$

where x and y are image coordinates, I(x,y) is the model of the spatial intensity profile of the RF signal, N is the number of RF receiver points, $I_n$ is the estimated signal intensity at the $n^{th}$ RF receiver point and is to be determined by the fitting procedure, R is the rate of decay in signal intensity with distance from said RF receiver points and is to be determined by the fitting procedure, $x_n$ is the x position of the $n^{th}$ RF receiver point, $y_n$ is the y position of the $n^{th}$ RF receiver point, and f is the degree of ellipticity to the concentric decay in RF signal intensity with increasing distance from said RF receiver points and is to be determined by the fitting procedure.

Preferably said selected measured RF signal intensities comprise pixels of maximal signal intensity in respective radial line segments of an image of the surrounding medium (hereinafter referred to as "selected pixels").

Preferably said method further comprises connecting said selected pixels by a line.

Preferably said method further comprises deriving from said trace local maxima in signal intensity.

Preferably when said magnetic resonance image is acquired in an axial plane said RF receiver points are located at the local maxima in signal intensity of the said selected pixels from said surrounding medium.

Preferably when said magnetic resonance image is acquired in said axial plane the said local maxima in signal intensity of the selected pixels are no closer than 12 pixels.

Preferably said local maxima in signal intensity determined from the selected pixels serve as starting values for the signal intensities $I_n$ of the said RF receiver points in the said fitting procedure.

Preferably said fitting procedure includes deriving an initial estimate of the rate R of decay of signal intensity with distance from said RF receiver points determined by:

locating local minima amongst said selected pixels in a manner consistent with determination of said local maxima;

for each RF receiver point locating two nearest local minima and fitting an exponential signal intensity decay curve as a function of the distance from the said RF receiver point to the signal intensities of the two local minima constrained to the signal intensity at the position of the said RF receiver point to determine an estimate of the rate $R_n$ of decay in signal intensity with distance away from the said RF receiver point;

calculating the average of the estimates of the rate of decay $R_n$ in signal intensity with distance from each RF receiver point which is to be used as an initial estimate of R.

Preferably when the magnetic resonance image is acquired in the axial plane the elliptical contours of the decay in the RF signal intensity from a given RF receiver point have their minor axes approximately normal to a plane of an RF receiver coil element of an MRI machine acquiring said image of said object in closest proximity to the given RF receiver point.

Preferably when the magnetic resonance image is acquired in the axial plane the angular alignment of each of the elliptical contours of the decay in the RF signal intensity from the RF receiver points is determined relative to said trace.

Preferably the angular alignment of the major axes of the elliptical contours of the decay in the RF signal intensity from the RF receiver points is determined relative to said trace by:

centering a window kernel on each RF receiver point and finding the two furthest positions from said RF receiver point at which said trace of the selected pixels passes through the perimeter of the window kernel; and, calculating the angle of the line bisecting said two furthest positions relative to the coronal plane.

Preferably said window kernel which is centered on said RF receiver points to determine the angular alignment of the elliptical contours of the decay in the RF signal intensity from said RF receiver points is a square window kernel not less than 13 pixels in width.

Preferably when the magnetic resonance image is acquired in an axial plane said model is formulated as:

$$I(x, y) = \sum_{n=1}^{N} I_n e^{-R\sqrt{(x-x_n)^2[1/f \cdot \cos^2\theta_n + f\sin^2\theta_n] + (y-y_n)^2[1/f\cdot\sin^2\theta_n + f\cos^2\theta_n] + (x-x_n)(y-y_n)[1/f\cdot\sin 2\theta_n - f\sin 2\theta_n]}}$$

where x and y are image coordinates, I(x,y) is the model of the spatial intensity profile of the RF signal, N is the number of RF receiver points, $I_n$ is the estimated signal intensity at the $n^{th}$ RF receiver point and is to be determined by the fitting procedure, R is the rate of decay in signal intensity with distance from the RF receiver points and is to be determined by the fitting procedure, $x_n$ is the x position of the $n^{th}$ RF receiver point, $y_n$ is the y position of the $n^{th}$ RF receiver point, f is the degree of ellipticity to the concentric reduction in RF signal intensity with increasing distance from the RF receiver points and is to be determined by the fitting procedure, and $\theta_n$ is the angular alignment of the major axis of the elliptical contour to the decay in the RF signal intensity from the $n^{th}$ RF receiver point with the coronal plane.

Preferably said model spatial intensity profile I(x,y) is fitted to the image intensities of the selected pixels from the medium bordering the object for optimum parameterisation of $I_n$, R and f to obtain an estimate of the spatial variation in RF signal intensity throughout the object.

Preferably said method further comprises determining a RF spatial attenuation profile with which to rescale the magnetic resonance image intensities within the said object and thus minimise the spatial variation in RF signal intensity throughout the object.

Preferably said RF spatial attenuation profile is determined by dividing the estimated RF signal intensity profile I(x,y) by the minimum or maximum value of I(x,y) within the region occupied by the object.

Preferably the spatial variation in RF signal intensity throughout the object is be minimised by dividing the image intensities within the object by the RF spatial attenuation profile.

Preferably said method further comprises, when the magnetic resonance image is a spin echo image, providing an estimate of the image intensities within the object at zero echo time by dividing the estimated signal intensities within the object at the given echo time by a percentage remaining signal intensity expected within the surrounding medium at the given echo time and then dividing this result by a ratio of hydrogen proton spin density expected of the bounding medium relative to hydrogen proton spin density expected of the object itself.

Preferably said method also comprises calculating transverse relaxation rates within the object from a series of spin echo images acquired of the object and surrounding medium at different echo times.

Preferably when the magnetic resonance image is a spin echo image, said method further comprises using the estimates of the image intensities within the object at zero echo time in the calculation of transverse relaxation rates within the object where the estimates are determined from a spin echo time image of shortest duration in the spin echo image series.

Preferably when the magnetic resonance image is a spin echo image, the transverse relaxation time of said surrounding medium is significantly greater than the spin echo time at which the image is acquired such that there is negligible decay in signal intensity throughout the medium from zero echo time.

Preferably when the object under consideration is the liver said surrounding medium is a layer of subcutaneous fat surrounding the abdomen.

Preferably when transverse relaxation rates are calculated within the liver from a series of spin echo images the subcutaneous fat is used to estimate image intensities within the liver at zero echo time to assist in the calculation of the transverse relaxation rates.

According to the present invention there is also provided a method enhancing a magnetic resonance (MR) image of an object comprising:

obtaining an initial MR image of the object;
estimating the spatial variation of magnetic resonance imaging radio frequency (RF) signal intensities within the object from measured RF signal intensities of a uniform spin density medium surrounding the object by:
acquiring a magnetic resonance image of an object bounded by a medium which is of essentially uniform spin density, on the length scale of resolution of the image;
formulating a semi-empirical mathematical model I(x,y) of the spatial variation in RF signal intensity within the said object;
fitting said model to selected measured RF signal intensities of said surrounding medium to obtain an estimate of the spatial variation of magnetic resonance imaging radiofrequency (RF) signal intensities within said object; and,
utilising the estimated spatial variation in RF signal intensity to rescale the initial MRI image by dividing the signal intensities of the image object by the RF signal intensity profile I(x,y).

BRIEF DESCRIPTION OF THE DRAWINGS

An embodiment of the present invention will now be described by way of example only with reference to the accompanying drawings in which.

DETAILED DESCRIPTION OF PREFERRED EMBODIMENTS

As explained in greater detail below with reference to the accompanying drawings, in broad terms embodiments of the present invention provide a method of estimating the spatial variation in RF signal intensity within magnetic resonance images of an object through the solution of a boundary value problem presented by a medium of essentially uniform spin density surrounding the object. From analysis of the surrounding medium, and the location of notional points of RF signal reception (hereinafter simply referred to as "RF receiver points"), a semi-empirical mathematical formulation of the decay profile of the RF signal intensity within the object is determined. The RF receiver points are located about the object in a manner consistent with the geometry of the RF detection coil elements in a magnetic resonance imager producing images of the object and the pattern of RF penetration throughout the object. These points are considered to be notional RF receiver points as they are not (usually) at the location of the actual RF detection coil elements of the imager but at locations which for the purposes of mathematical modelling have a substantially similar appearance to the positioning of the RF detection coil elements. The detection sensitivity of the RF receiver points is assumed to diminish in a concentric manner with increasing distance from the points, with the degree of ellipticity adjusted relative to the signal intensity pattern throughout the medium surrounding the object. To this end the RF receiver points may be located on the surrounding medium though this is not essential to the present invention. The sensitivity of each RF receiver point is also adjusted relative to the amplitude of the signal intensities throughout the bounding medium. The resulting semi-empirical mathematical formulation of the decay profile of the RF signal intensity throughout the object is then fitted to selected signal intensities from the medium bordering the object to obtain an estimate of the spatial variation in RF signal intensity within the object.

Figure 6:
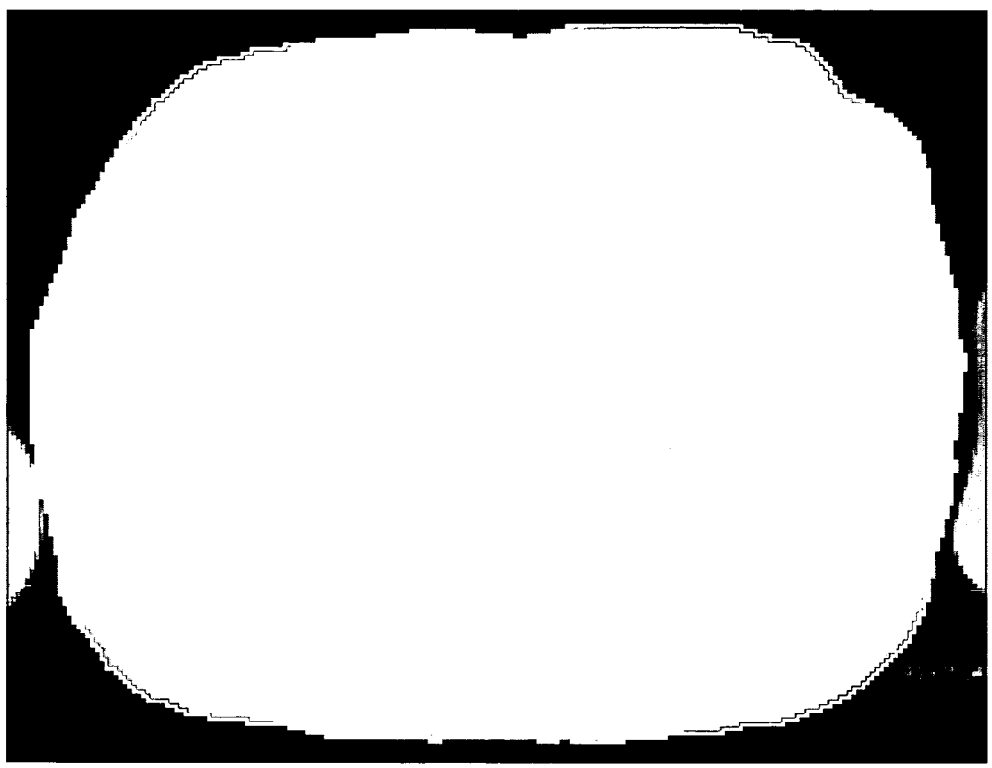
FIG. 6 shows the result of fitting the model spatial intensity profile of the decay in signal intensity from the RF receiver points to the image intensities of selected pixels within the subcutaneous fat to obtain an estimate of the spatial variation in RF signal intensity throughout the liver of the patient in FIG. 1.

More particularly, in the following description, a method is described for estimating magnetic resonance image intensities (as illustrated in FIG. 6) within an object such as a liver 10 (shown in FIGS. 1 and 7A) to map the spatial variation in RF signal intensity (FIG. 6) within the object 10 that is due to instrumental and/or object effects. The method involves acquiring a magnetic resonance image of the object 10 surrounded by a medium of essentially uniform spin density, such as that provided by a layer of subcutaneous fat 12. A semi-empirical mathematical model is formulated of the spatial variation in RF signal intensity within the region encompassed by the surrounding medium 12 and which includes the object 10. Examples of two particular models are provided below, but in general terms, the model provides for a reduction, and in particular an exponential reduction, in RF signal intensity with increasing distance away from notional points of RF signal reception 14 (referred to as "RF receiver points 14") within the surrounding medium 12. The RF receiver points 14 are located at the local maxima of a selection of measured RF signal intensities from the surrounding medium 12. Prior to fitting, an estimate of the rate of decay in signal intensity from the RF receiver points is determined with reference to local minima 16 amongst the selected pixels from the surrounding medium 12. The model is then fitted to the image intensities of the selected pixels from the surrounding medium 12 to obtain an estimate of the spatial variation in RF signal intensity within the object 10 that is due to instrumental and/or object effects.

Figure 1:
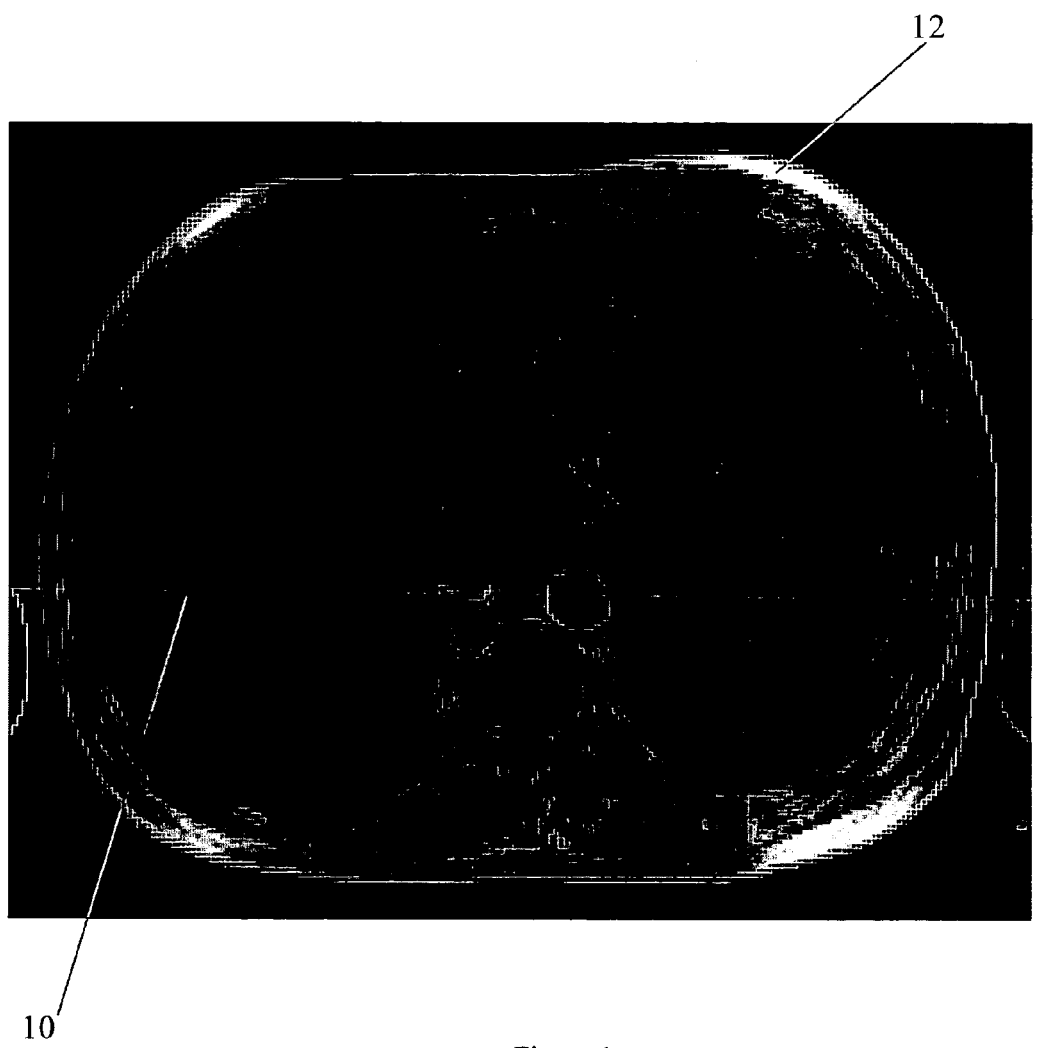
FIG. 1 is a magnetic resonance spin echo image of the abdomen of a patient with liver iron overload acquired at an echo time of 6 ms and a repetition time of 2500 ms.

FIG. 1 illustrates an input image for the present method. In this regard FIG. 1 illustrates a $T_2$-weighted magnetic resonance image acquired of the abdomen of a patient in which the object under particular study is a liver 10. The layer of subcutaneous fat 12 which surrounds the liver 10 provides a suitable surrounding medium of essentially uniform spin density which is used in the present method to estimate the spatial variation in RF signal intensity throughout the liver. In this instance, the image illustrated in FIG. 1 shows a patient with liver iron overload, the image being acquired at a spin echo time TE of 6 ms and a repetition time TR of 2500 ms.

Figure 2:
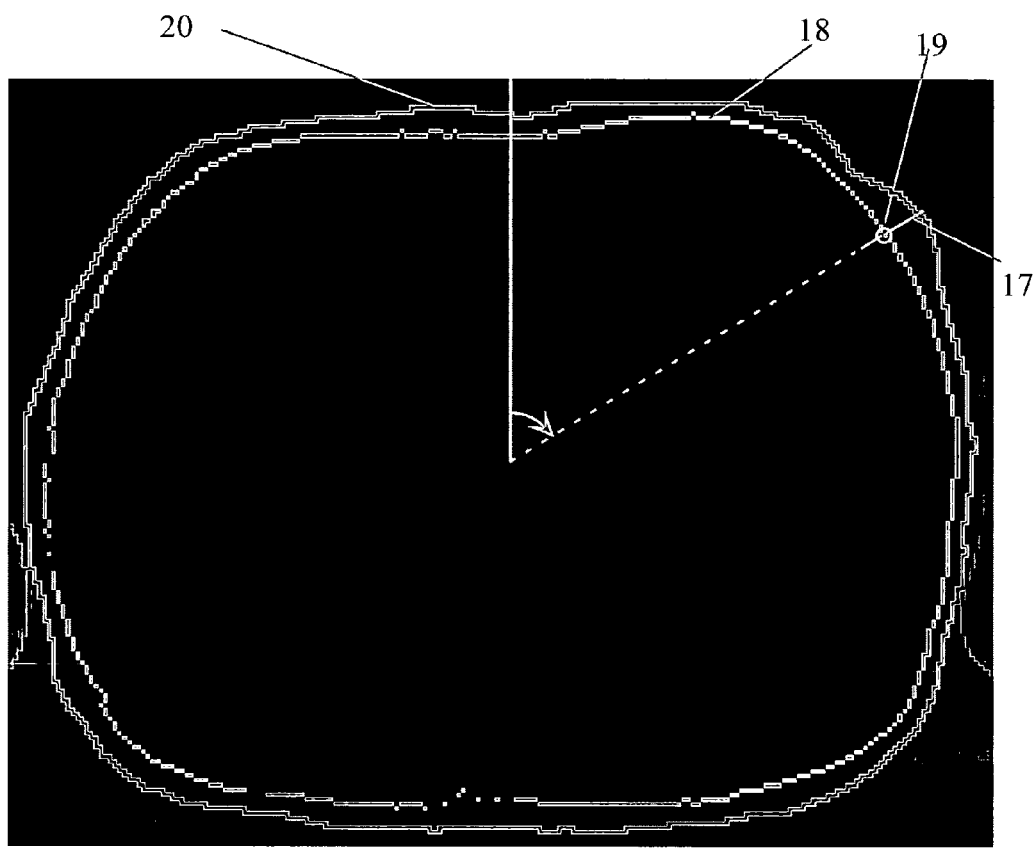
FIG. 2 shows a trace of maximal pixel signal intensities determined within a layer of subcutaneous fat surrounding the liver to a width of one pixel for the patient in FIG. 1.

FIG. 2 illustrates a trace 18 of selected pixels within the subcutaneous fat 12 of the patient to be used in the estimation of the spatial variation in RF signal intensity within the liver 10. In one embodiment the selected pixels used to produce the trace 18 are pixels of maximal signal intensity 19 in respective radial line segments 17 of the image of the subcutaneous fat 12. Moreover the pixels 19 are selected by an edge detection algorithm that locates the maximal signal intensities within the subcutaneous fat 12 to a width of one pixel around the periphery of the patient. A region of interest 20, drawn around the patient in FIG. 2 within which is shown the trace 18 of the maximal signal intensities within the subcutaneous fat 12, is used as a reference for the edge detection algorithm. The edge detection algorithm in essence look for the pixel of maximum intensity along each of the radial line segments 17 in the subcutaneous fat 12. It should be understood that the maximal intensities could be derived in relation to horizontal and vertical line segments from the region of interest 20 toward the centre of the body, rather than with reference to the radial line segments.

Figure 3:
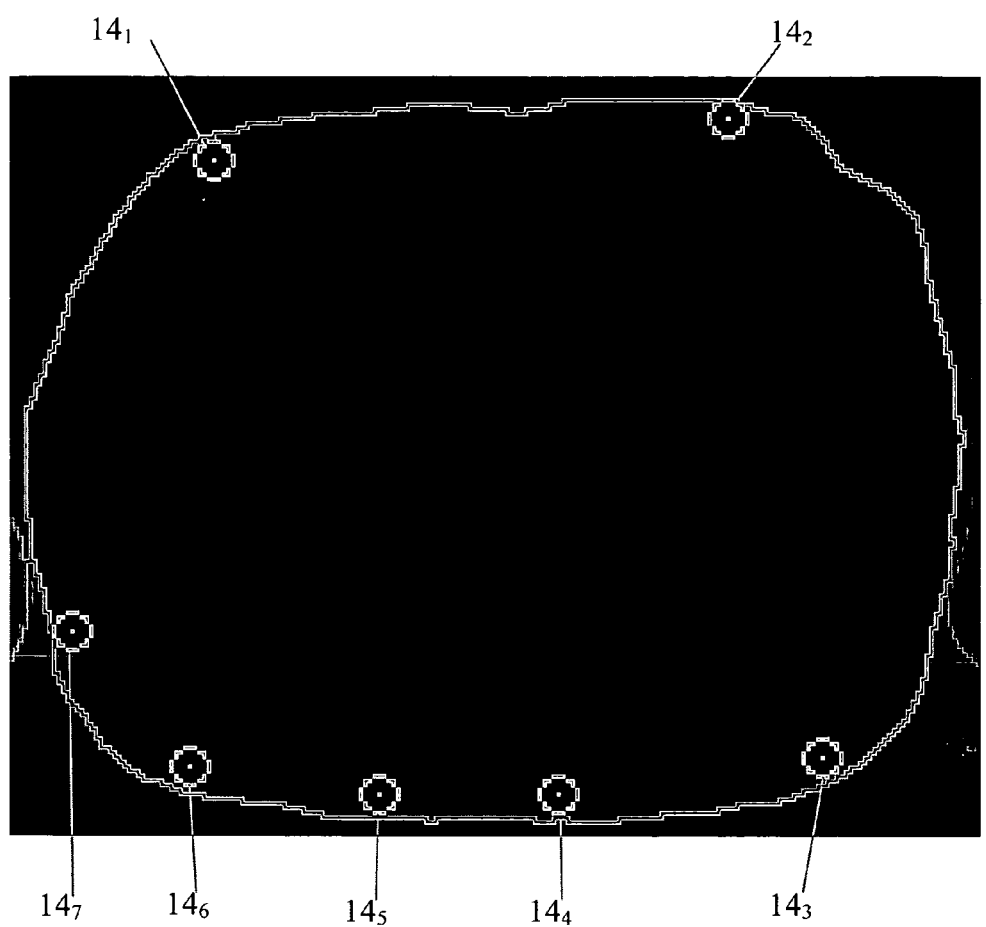
FIG. 3 shows the local maxima in signal intensity determined from the trace of the maximal pixel signal intensities in FIG. 2, which correspond to the positions of the RF receiver points.

FIG. 3 shows the local maxima 14 in signal intensity within the subcutaneous fat 12 determined from the trace 18 of the maximal signal intensities shown in FIG. 2. The local maxima 14 are located by sliding a window of constant width along the trace and for each position of the window ascertaining the maximum signal intensity for the length of the window. A second pass is then performed by sliding the window along the maximised signal trace and calculating the mean signal intensity of the maximised signal trace at each position of the window. Where the mean signal intensity is equal to the maximised signal intensity at a central window position, a local maximum 14 in signal intensity is recorded. Ideally the window is selected to be at least 12 pixels wide so that adjacent local maxima are no closer than 12 pixels.

As illustrated in FIG. 3, seven local maxima $14_1$–$14_7$ are located. It would be recognised however that the number of local maxima will vary from patient to patient and object to object. The locations of the local maxima are taken as the positions of the notional RF receiver points for the mathematical description of the spatial intensity profile I(x,y) of the detected RF signal within the liver. While the local maxima in the bounding medium 12 are used as the RF receiver points 14, it is important to note that these points do not have to be located on the medium 12. The location of these points is used to determine the geometry of the spatial intensity profile. In providing the mathematical model of the spatial intensity profile I(x,y) it is assumed that signal strength diminishes or decays with distance from the points 14. Moreover, this decay is modelled as being an exponential decay and it is further assumed in the formulation of the model that RF signal intensity diminishes in a concentric manner from the points 14. On the basis of these assumptions, the following two mathematical models of the spatial intensity profile I(x,y) may be provided:

$$I(x, y) = \sum_{n=1}^{N} I_n e^{-R\sqrt{1/f \cdot (x-x_n)^2 + f \cdot (y-y_n)^2}} \quad (1)$$

$$I(x, y) = \sum_{n=1}^{N} I_n e^{-R\sqrt{(x-x_n)^2 [1/f \cdot \cos^2\theta_n + f \sin^2\theta_n] + (y-y_n)^2 [1/f \cdot \sin^2\theta_n + f\cos^2\theta_n] + (x-x_n)(y-y_n)[1/f \cdot \sin 2\theta_n - f \sin 2\theta_n]}} \quad (2)$$

where x and y are image coordinates, N is the number of RF receiver points 14, $I_n$ is the signal intensity at the nth RF receiver point $14_n$ and is to be determined by the fitting procedure, R is the rate of decay in intensity of the detected RF signal with distance from the RF receiver points 14 and is to be determined by the fitting procedure, $x_n$ is the x position of the $n^{th}$ RF receiver point $14_n$, $y_n$ is the y position of the $n^{th}$ RF receiver point $14_n$, f is the degree of ellipticity to the concentric reduction in RF signal intensity with increasing distance from the RF receiver points 14 and is to be determined by the fitting procedure, and $\theta_n$ is the angle of the major axis of the elliptical contour to the decay in the RF signal intensity from the nth RF receiver point $14_n$ with the coronal plane. In relation to FIG. 3, the intensity values of the local maxima are taken as initial estimates of the signal intensities $I_n$ at the N RF receiver points throughout the subcutaneous fat. For the example under discussion, N=7.

The mathematical model (2) above is a more general form of mathematical model (1). Both models provide for an exponential decay in signal intensity or strength from the RF receiver points in an elliptical manner. However model (2) also allows for orientation of the major and minor axes of the elliptical decay in signal intensity for each of the RF receiver points 14. The model (2) reduces to the model (1) if it is assumed that major axis of the elliptical decay contours is aligned with the coronal plane 13, this is equivalent to $\theta_n$ being 0°.

Figure 4:
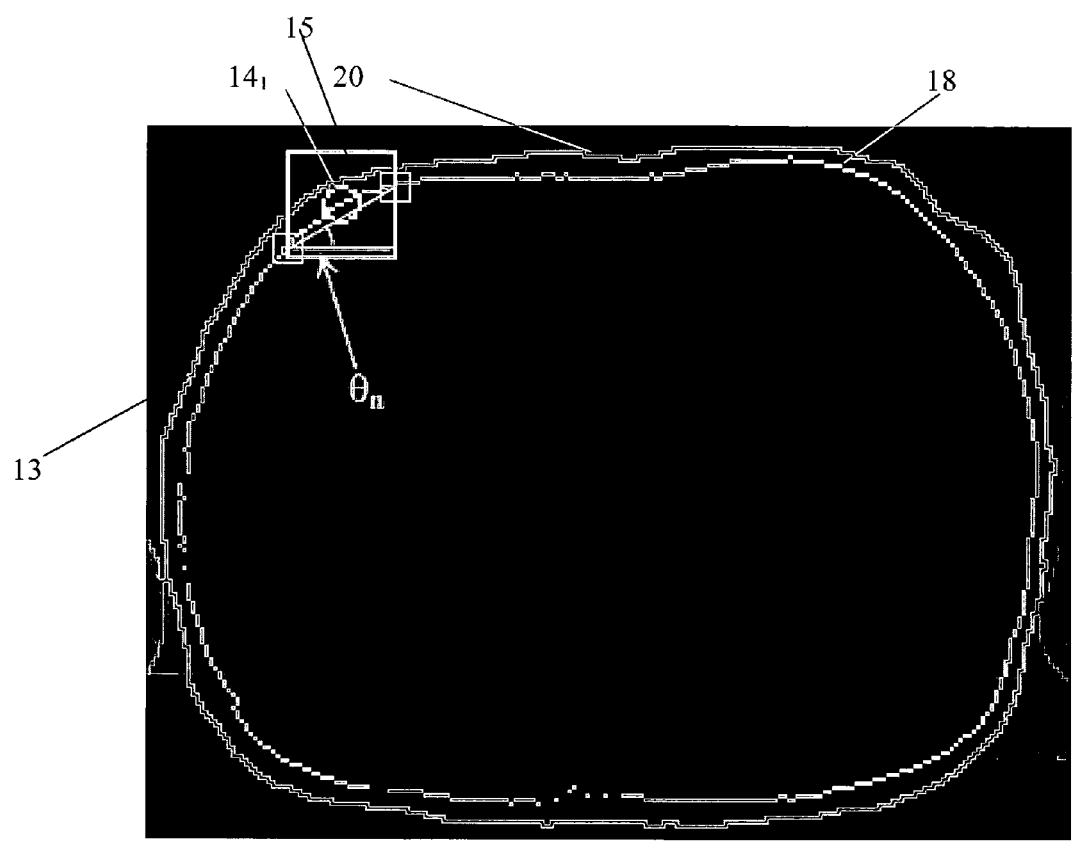
FIG. 4 illustrates the manner in which an angle $\theta_n$ of a major axis of an elliptical contour to the decay in the RF signal intensity from a given RF receiver point is determined relative to the coronal plane from the trace of the maximal signal intensities throughout the subcutaneous fat.

FIG. 4 illustrates the manner in which the angular alignment of the major axis of the elliptical contour of the decay in the RF signal intensity from a given RF receiver point 14 is determined relative to the coronal plane 13 from the trace of the maximal signal intensities throughout the subcutaneous fat as shown in FIG. 2. A window kernel 15 is centered on a given RF receiver point and the two most extreme positions at which the trace 18 of the maximal signal intensities passes through the perimeter of the window kernel 21 are determined. For the example in FIG. 4, the window kernel 15 is square with a width of 25 pixels. The angle θ of the line bisecting the two said extreme positions on the perimeter of the window kernel is then determined relative to the coronal plane 13, as denoted in FIG. 4. For the $n^{th}$ RF receiver point $14_n$, this angle is denoted $\theta_n$, and is used in the model (2) of the spatial intensity profile I(x,y) of the detected RF signal intensity within the liver.

Figure 5A:
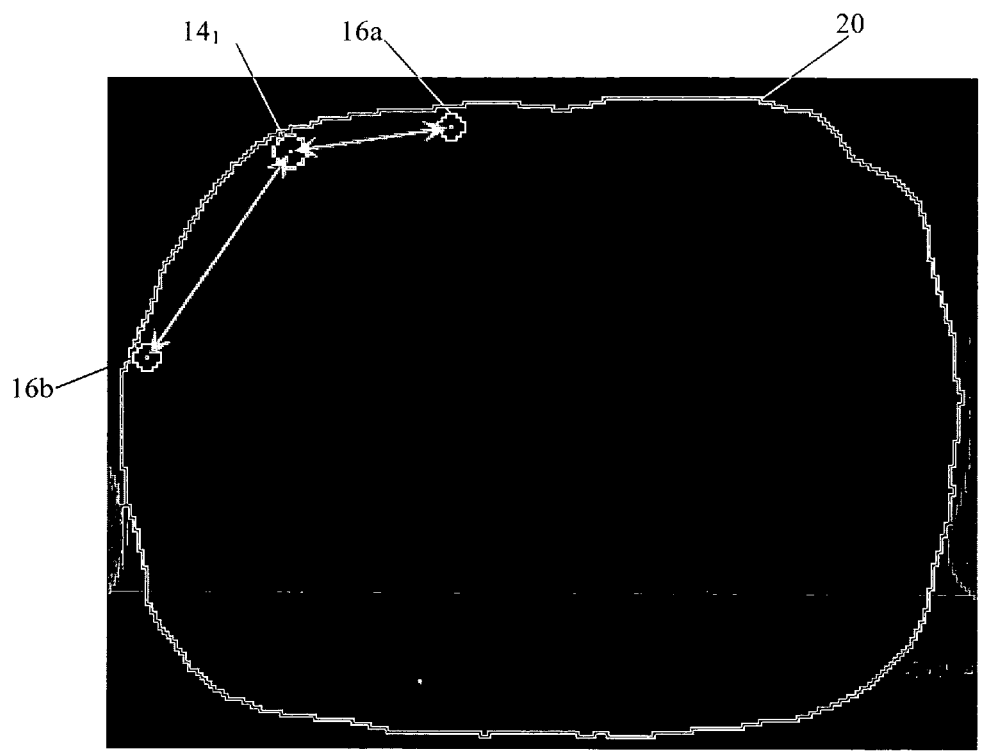
FIG. 5A shows a selected RF receiver point from FIG. 3 and the two nearest neighbouring local minima.
Figure 5B:
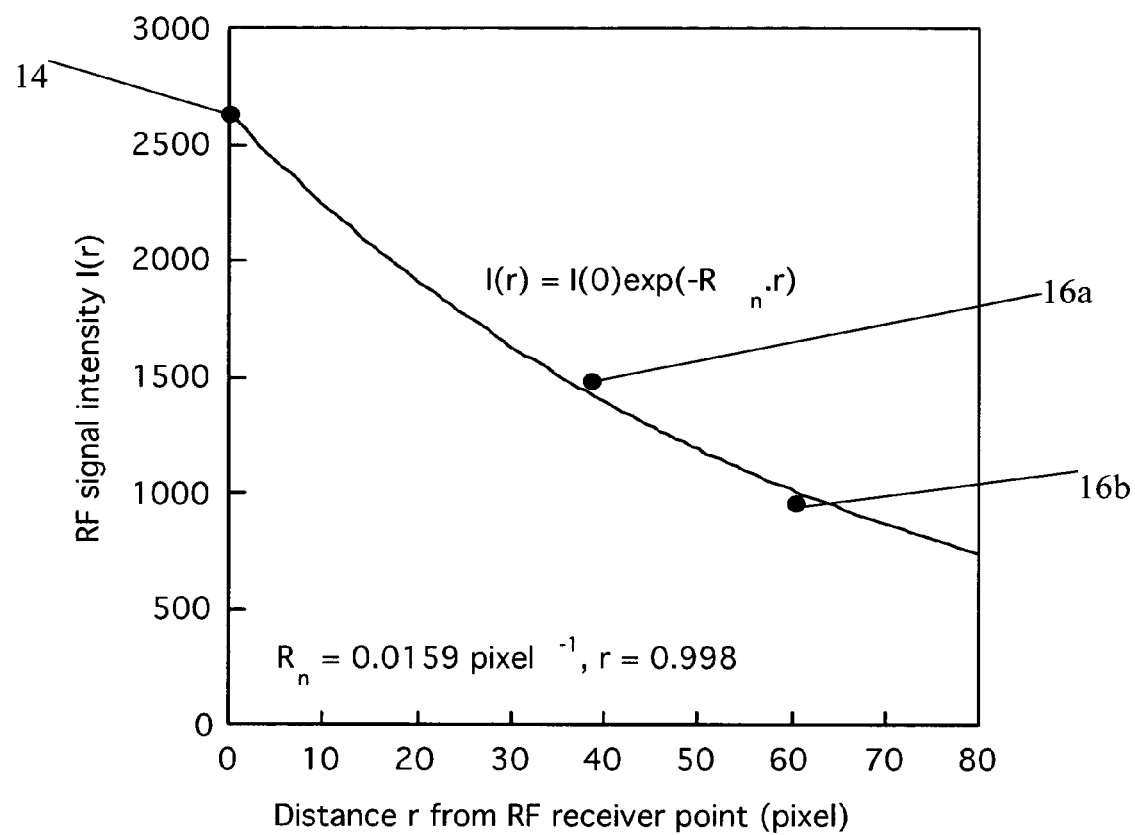
FIG. 5B shows the intensity of the local maximum at the RF receiver point and the intensity of the two nearest neighbouring local minima plotted as a function of distance in pixels from the RF receiver point and to which has been fitted an exponential signal intensity decay curve for the determination of $R_n$.

FIGS. 5A and 5B illustrate how an initial estimate of the rate R of decay in intensity of the RF signal with distance from the RF receiver points 14 is determined by way of example to one RF receiver point $14_1$. FIG. 5A shows a selected RF receiver point $14_1$ from FIG. 3, and the two nearest neighbouring local minima 16a and 16b, determined in a manner consistent with that for location of the local maxima in the subcutaneous fat 12. FIG. 5B shows the intensity of the local maxima at the RF receiver point 14 and the intensity of the two neighbouring local minima plotted as a function of distance in pixels from the RF receiver point 14. An exponential decay curve is fitted to the signal intensity data points with the rate $R_n$ of decay in signal intensity as the unknown parameter, and with the intensity at zero distance from the RF receiver point $14_1$ fixed to the intensity of the local maxima at that point. This procedure is repeated for each RF receiver point 14, for which the estimates of the rate $R_n$ of decay in signal intensity with distance from each RF receiver point 14 are averaged to give an initial estimate of R, the rate of decay in intensity of the detected RF signal with distance from the RF receiver points.

Figure 7A:
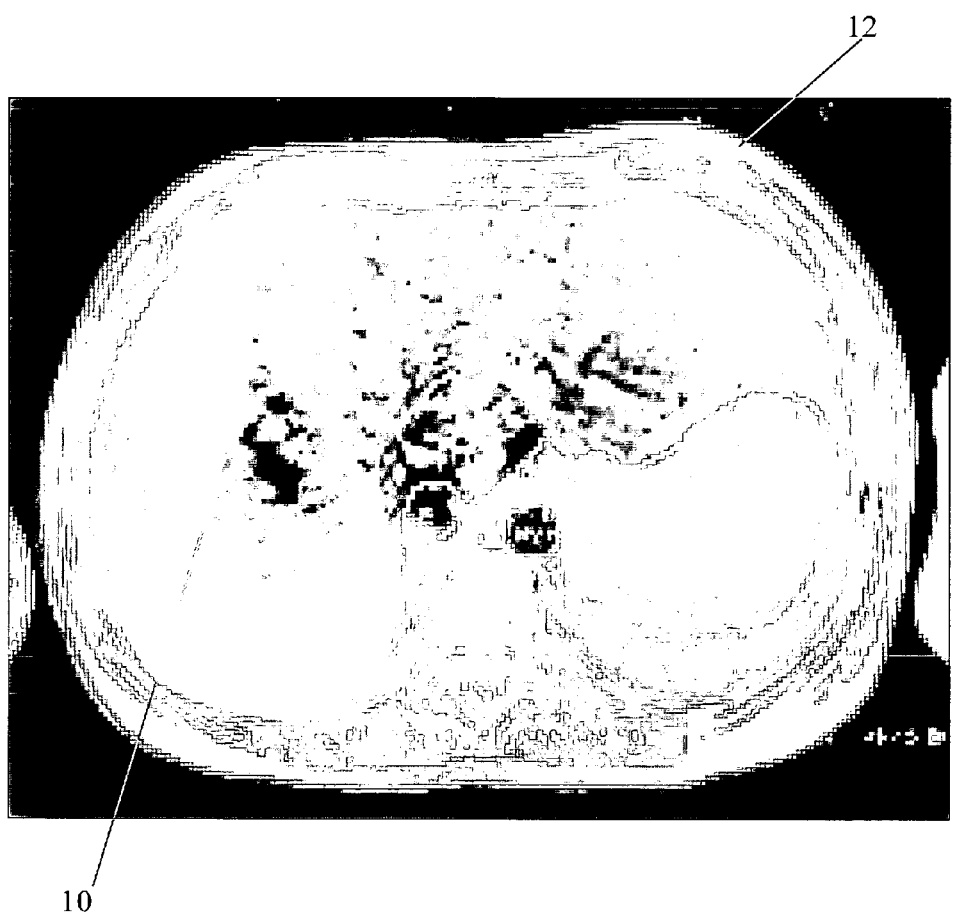
FIGS. 7A & 7B show the spin echo image of FIG. 1 before (FIG. 7A) and after (FIG. 7B) reduction of the RF signal intensity non-uniformities throughout the liver via the estimated spatial variation in RF signal intensity of FIG. 6 (with the contrast enhanced to accentuate image differences)
Figure 7B:
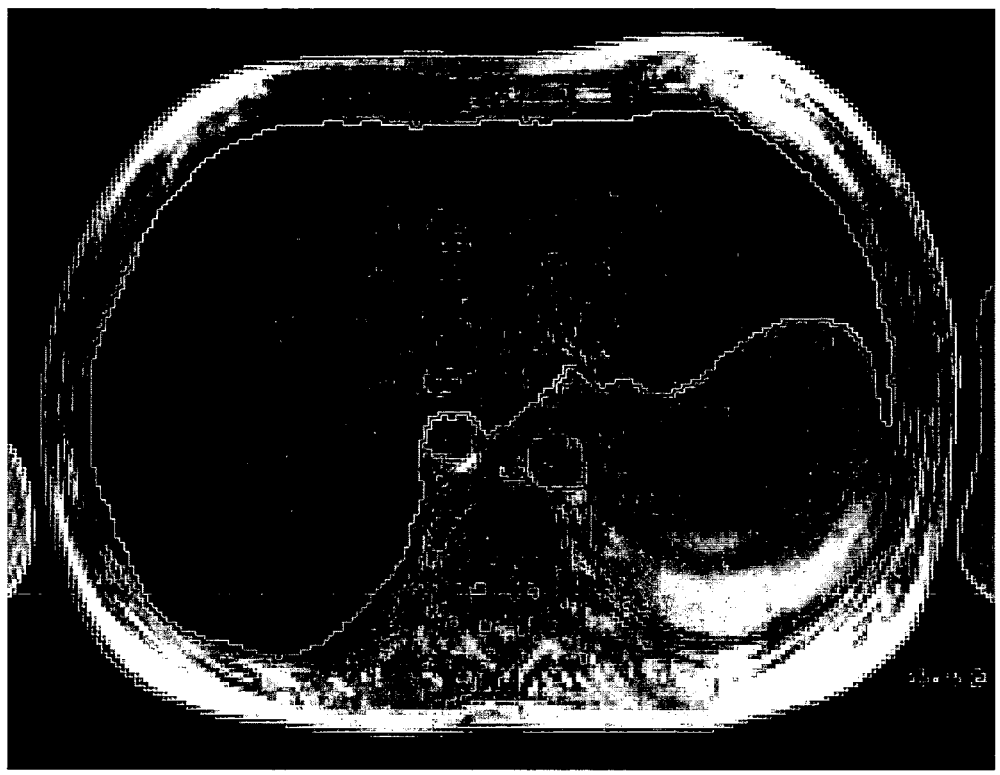

FIG. 6 shows the result of fitting the model spatial intensity profile I(x,y) to the selected image intensities from the subcutaneous fat 12 to obtain an estimate of the spatial variation in RF signal intensity throughout the liver 10. The accuracy of the fit is improved by removing any signal intensities from the trace 18 of the maximal signal intensities throughout the subcutaneous fat 12 that are either inconsistent with the presence of fat or are otherwise erroneous. The projected signal intensities may be used to rescale the magnetic resonance image intensities within the liver and thus minimise the spatial variation in RF signal intensity throughout the liver, as shown in FIGS. 7A and 7B. FIG. 7A is the spin echo image of FIG. 1 redisplayed with increased image contrast, and for which a region of interest has been drawn about the liver 10. FIG. 7B shows the liver signal intensities with a reduced variation in RF signal intensity, in which the liver signal intensities have been divided through by a RF spatial attenuation profile determined from the fitted spatial intensity profile I(x,y). In this instance, the RF spatial attenuation profile was determined by dividing the fitted RF signal intensity profile I(x,y) by the minimum value of I(x,y) within the region occupied by the liver.

Figure 8:
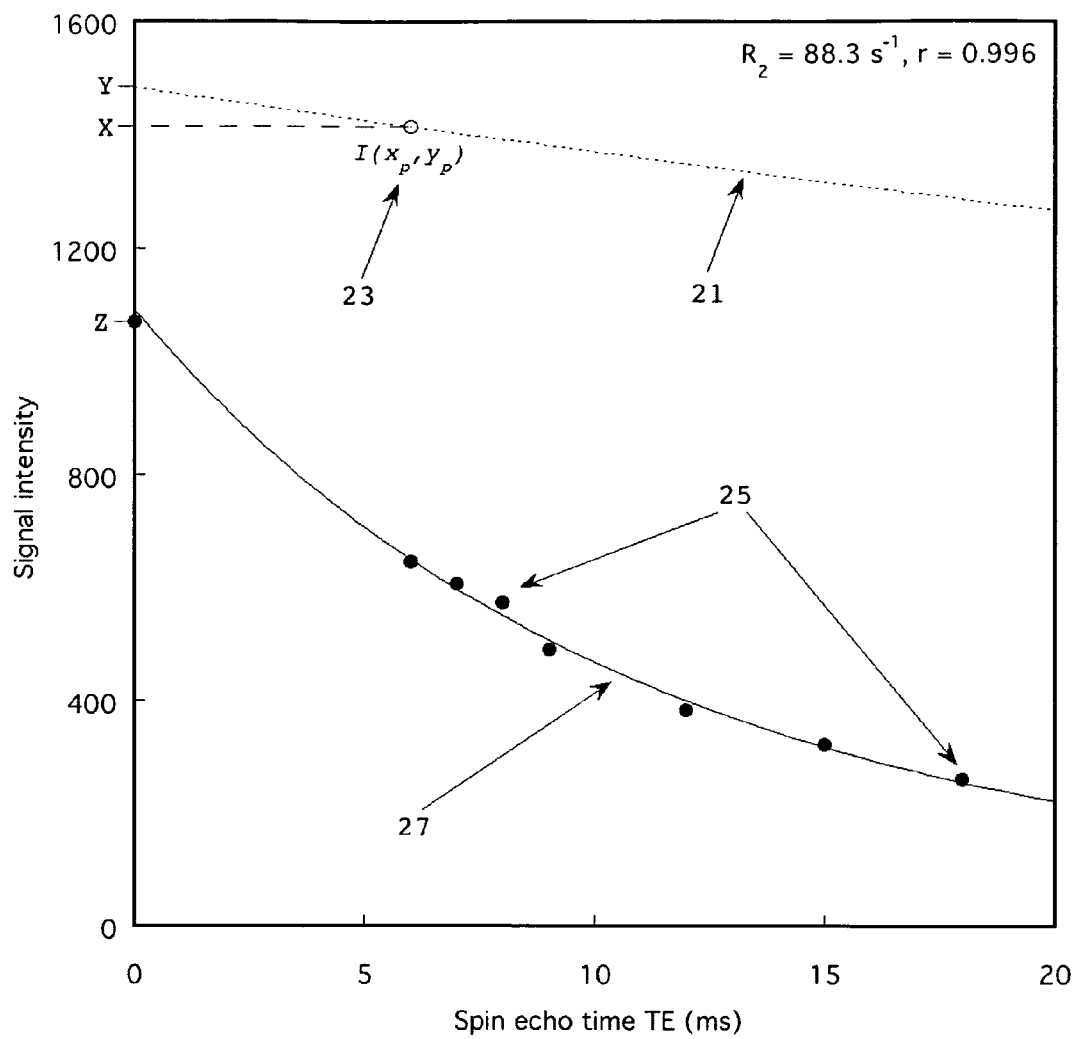
FIG. 8 shows a bi-exponential transverse magnetisation decay curve fitted to the signal intensity within the liver for a pixel p at position $(x_p, y_p)$ of the patient in FIG. 1 (for seven different spin echo image measurements) plotted as a function of the spin echo time, with the estimate of the initial signal intensity within the liver at zero echo time at pixel position p is included as an additional datum in the fit. Also shown is the expected signal decay rate within the subcutaneous fat relative to the RF spatial intensity profile value I $((x_p, y_p)$ at pixel position p.

FIG. 8 illustrates application of the estimated spatial variation in RF signal intensity within the liver to facilitate the calculation of transverse relaxation rate ($R_2$) within the liver. This application is particularly useful where the transverse relaxation rates within the liver are determined from a series of spin echo images where the signal intensities are predominantly less than 50% of the initial signal intensity at zero echo time. The RF signal intensity profile I(x,y) fitted to the maximal signal intensities within the subcutaneous fat is transformed into an estimate of the image intensities within the liver at zero echo time by dividing I(x,y) by the percentage remaining signal intensity expected within the subcutaneous fat at the given echo time, and then dividing this result by the ratio of the hydrogen proton spin density expected of the subcutaneous fat relative to the hydrogen proton spin density expected of the liver. The estimate of the image intensities within the liver at zero echo time may be then included as additional data points at zero echo time in calculation of the transverse relaxation rates within the liver. This is illustrated in FIG. 8 where the signal intensity within the liver for a pixel p at position ($x_p$,$y_p$) from seven separate spin echo time measurements is plotted versus echo time, with the estimate of the initial signal intensity within the liver at zero echo time (determined from the 6 ms spin echo image) at pixel postion p is included as an additional datum at zero echo time. In determining the initial signal intensity within the liver, the percentage remaining signal intensity expected within the subcutaneous fat at the given echo time of 6 ms as shown in FIG. 8 is effectively given by the values X divided by Y which are marked on the signal intensity axis. The value for the percentage remaining signal intensity expected within the subcutaneous fat is in practice estimated from the expected signal decay rate for the subcutaneous fat ($R_{2Fat}$) relative to the given echo time (TE) by the expression $\exp(-R2_{Fat}.TE)$, where exp( ) is the exponential function. The ratio of the hydrogen proton spin density expected of the subcutaneous fat relative to the hydrogen proton spin density expected of the liver is evidenced in FIG. 8 by the signal intensity axis values of Y divided by Z. The transverse relaxation rate characteristic of the liver in the example of FIG. 8 was determined by fitting a bi-exponential signal decay to the data points. The inclusion of the estimated signal intensity at zero echo time implicitly improves the accuracy of the calculated $R_2$ by including extractable information about signal intensities at points in time much earlier than that captured in the shortest echo time image. This method is especially important in the accurate modelling of bi-exponential transverse magnetisation decay processes.

From the above description, it will be apparent to those skilled in the relevant arts that the present method has numerous advantages and benefits over prior art methods for correcting spatial non-uniformities in RF signal intensity within magnetic resonance images. Specifically, the present method enables the determination of a RF signal intensity correction surface that is particularly sensitive to non-uniformities in the RF receiving coil profile as well as signal intensity attenuation within the object under study. This is facilitated through the concurrent imaging of a medium of essentially uniform spin density bordering the object from which the pattern of RF signal intensity attenuation within the object is estimated. A semi-empirical mathematical model of the spatial variation in RF signal intensity within the object is determined through the location of notional RF receiver points about the boundary medium, from which a concentric decay to the detected RF signal intensity is assumed with increasing distance from the said points. The concentric pattern of decay from each RF receiver points is taken to be elliptical, with the major axes of the elliptical contours approximately aligned with the RF coil. The ellipse is a reasonable model of the decay profile in RF signal intensity that results from the convolution of the RF coil geometry with the internal attenuation effects from the object under study.

Now that an embodiment of the invention has been described it will be apparent to those skilled in the relevant arts that numerous modifications and variations may be made without departing from the basic inventive concepts. For example, the RF receiver points need not be constrained to location at the maximal signal intensities on the boundary medium, or even on the boundary medium itself. Further, the decay in signal intensity with increasing distance from the RF receiver points need not follow an exponential decay, or the same decay rate from each point. In addition, the signal intensities within the object under study may be rescaled by direct division with the fitted signal intensity profile to form a signal intensity ratio of the object image intensities relative to the boundary medium intensities. For example, in abdominal imaging, the signal intensity ratio of liver to subcutaneous fat may formulated at every point within the liver with reference to the projected signal intensities determined from the subcutaneous fat. Finally, it should be noted that the method described in this specification is broadly applicable to the estimation of magnetic resonance image intensities in which there is a continuous decay in signal intensity with distance from several points of maximal signal intensity within the image.

All such modifications and variations that would be obvious to a person of ordinary skill in the art are deemed to be within the scope of the present invention the nature of which is to be determined from the above description and the appended claims.

What is claimed is:

1. A method of estimating the spatial variation of magnetic resonance imaging radio frequency (RF) signal intensities within an object from measured RF signal intensities of a uniform spin density medium surrounding the object, said method comprising:

acquiring a magnetic resonance image of an object bounded by a medium which is of essentially uniform spin density, on the length scale of resolution of the image;

formulating a semi-empirical mathematical model of the spatial variation in RF signal intensity within the said object; and, fitting said model to selected measured RF signal intensities of said surrounding medium to obtain an estimate of the spatial variation of magnetic resonance imaging radiofrequency (RF) signal intensities within said object.

2. A method according to claim 1 wherein said step of formulating said semi-empirical mathematical model of the spatial variation in RF signal intensity within the object comprises:

locating a plurality of points in a plane of said image which are notionally considered to act as apparent receivers of RF signals (hereinafter referred to as "RE receiver points"); and, formulating a spatial profile of RF signal intensity within said object in said plane of said image relative to the said RE receiver points.

3. A method according to claim 2 wherein said RE receiver points are located on said surrounding medium.

4. A method according to claim 2 wherein said spatial intensity profile is formulated in a manner which provides a concentric reduction in RF signal intensity with increasing distance from said RF receiver points.

5. A method according to claim 4 wherein said reduction in RF signal intensity is formulated as having the same rate of reduction in signal intensity with increasing distance from all said RF receiver points.

6. A method according to claim 5 wherein said spatial profile is formulated as having a reduction in signal intensity with the reciprocal of the distance from said RF receiver points raised to a chosen power.

7. A method according to claim 5 wherein said spatial profile is formulated as having an exponential reduction in signal intensity with increasing distance from said RF receiver points.

8. A method according to claim 7 wherein when the magnetic resonance image is acquired in an axial plane said semi-empirical mathematical model is formulated as:

$$I(x, y) = \sum_{n=1}^{N} I_n e^{-R\sqrt{(x-x_n)^2[1/f \cdot \cos^2\theta_n + f\sin^2\theta_n] + (y-y_n)^2[1/f \cdot \sin^2\theta_n + f\cos^2\theta_n] + (x-x_n)(y-y_n)[1/f \cdot \sin 2\theta_n - f\sin 2\theta_n]}}$$

where x and y are image coordinates, I(x,y) is the model of the spatial intensity profile of the RF signal, N is the number of RF receiver points, $I_n$ is the estimated signal intensity at the $n^{th}$ RF receiver point and is to be determined by the fitting procedure, R is the rate of decay in signal intensity with distance from the RF receiver points and is to be determined by the fitting procedure, $x_n$ is the x position of the $n^{th}$ RF receiver point, $y_n$ is the y position of the $n^{th}$ RF receiver point, f is the degree of ellipticity to the concentric reduction in RF signal intensity with increasing distance from the RF receiver points and is to be determined by the fitting procedure, and $\theta_n$ is the angular alignment of the major axis of the elliptical contour to the decay in the RF signal intensity from the $n^{th}$ RF receiver point with the coronal plane.

9. A method according to claim 7 wherein said semi-empirical mathematical model is formulated as:

$$I(x, y) = \sum_{n=1}^{N} I_n e^{-R\sqrt{1/f \cdot (x-x_n)^2 + f \cdot (y-y_n)^2}}$$

where x and y are image coordinates, I(x,y) is the model of the spatial intensity profile of the RF signal, N is the number of RF receiver points, $I_n$ is the estimated signal intensity at the $n^{th}$ RF receiver point and is to be determined by the fitting procedure, R is the rate of decay in signal intensity with distance from said RF receiver points and is to be determined by the fitting procedure, $x_n$ is the x position of the $n^{th}$ RF receiver point, $y_n$ is the y position of the $n^{th}$ RE receiver point, and f is the degree of ellipticity to the concentric decay in RE signal intensity with increasing distance from said RE receiver points and is to be determined by the fitting procedure.

10. A method according to claim 9 wherein said selected measured RF signal intensities comprise pixels of maximal signal intensity in respective radial line segments of an image of the surrounding medium (hereinafter referred to as "selected pixels").

11. A method according to claim 10 further comprising connecting said selected pixels by a line to form a trace.

12. A method according to claim 11 further comprising said method further comprises deriving from said trace local maxima in signal intensity for each of said radial line segments.

13. A method according to claim 12 wherein when said magnetic resonance image is acquired in an axial plane said RE receiver points are located at the local maxima in signal intensity of the said selected pixels.

14. A method according to claim 13 wherein when said magnetic resonance image is acquired in said axial plane the said local maxima in signal intensity of the selected pixels are no closer than 12 pixels.

15. A method according to claim 14 wherein said local maxima in signal intensity determined from the selected pixels serve as starting values for the signal intensities $I_n$ of the said RF receiver points in the said fitting procedure.

16. A method according to claim 15 wherein said fitting procedure includes deriving an initial estimate of the rate R of decay of signal intensity with distance from said RF receiver points determined by:
  locating local minima amongst said selected pixels in a manner consistent with determination of said local maxima;
  for each RF receiver point locating two nearest local minima and fitting an exponential signal intensity decay curve as a function of the distance from the said RF receiver point to the signal intensities of the two local minima constrained to the signal intensity at the position of the said RF receiver point to determine an estimate of the rate $R_n$ of decay in signal intensity with distance away from the said RF receiver point;
  calculating the average of the estimates of the rate of decay $R_n$ in signal intensity with distance from each RF receiver point which is to be used as an initial estimate of R.

17. A method according to claim 11 wherein when the magnetic resonance image is acquired in the axial plane the angular alignment of each of the elliptical contours of the decay in the RF signal intensity from the RF receiver points is determined relative to said trace.

18. A method according to claim 17 wherein the angular alignment of the major axes of the elliptical contours of the decay in the RF signal intensity from the RF receiver points is determined relative to said trace by:
  centering a window kernel on each RF receiver point and finding the two furthest positions from said RF receiver point at which said trace of the selected pixels passes through the perimeter of the window kernel; and,
  calculating an angle of a line bisecting said two furthest positions relative to the coronal plane.

19. A method according to claim 18 wherein said window kernel which is centered on said RF receiver points to determine the angular alignment of the elliptical contours of the decay in the RF signal intensity from said RF receiver points is a square window kernel not less than 13 pixels in width.

20. A method according to claim 9, wherein when the magnetic resonance image is acquired in the axial plane the elliptical contours of the decay in the RF signal intensity from a given RF receiver point have their minor axes approximately normal to a plane of an RF receiver coil element of an MRI machine acquiring said image of said object in closest proximity to the given RF receiver point.

21. A method according to claim 9 wherein said model spatial intensity profile I(x,y) is fitted to the image intensities of the selected pixels for optimum parameterisation of $I_n$, R and f to obtain an estimate of the spatial variation in RF signal intensity throughout the object.

22. A method according to claim 9 wherein said method further comprises determining a RF spatial attenuation profile with which to rescale the magnetic resonance image intensities within the said object and thus minimise the spatial variation in RF signal intensity throughout the object.

23. A method according to claim 22 wherein said RF spatial attenuation profile is determined by dividing the estimated RF signal intensity profile I(x,y) by the minimum or maximum value of I(x,y) within the region occupied by the object.

24. A method according to claim 23 wherein the spatial variation in RF signal intensity throughout the object is be minimised by dividing the image intensities within the object by the RF spatial attenuation profile.

25. A method according to claim 1 further comprising when the magnetic resonance image is a spin echo image, providing an estimate of the image intensities within the object at zero echo time by dividing the estimated signal intensities within the object at the given echo time by a percentage decay in signal intensity expected within the surrounding medium at the given echo time and then dividing this result by a ratio of hydrogen proton spin density expected of the bounding medium relative to hydrogen proton spin density expected of the object itself.

26. A method according to claim 25 wherein calculating transverse relaxation rates within the object from a series of spin echo images acquired of the object and surrounding medium at different echo times.

27. A method according to claim 26 wherein when the magnetic resonance image is a spin echo image said method further comprises using the estimates of the image intensities within the object at zero echo time in the calculation of transverse relaxation rates within the object where the estimates are determined from a spin echo time image of shortest duration in the spin echo image series.

28. A method according to claim 1 wherein when the object under consideration is the liver said surrounding medium is a layer of subcutaneous fat surrounding the abdomen.

29. A method according to claim 28 wherein when transverse relaxation rates are calculated within the liver from a series of spin echo images the subcutaneous fat is used to estimate image intensities within the liver at zero echo time to assist in the calculation of the transverse relaxation rates.

30. A method of enhancing a magnetic resonance image (MRI) of an object comprising:
   obtaining an initial MRI image of the object;
   estimating the spatial variation of magnetic resonance imaging radio frequency (RF) signal intensities within the object from measured RF signal intensities of a uniform spin density medium surrounding the object by:
   acquiring a magnetic resonance image of an object bounded by a medium which is of essentially uniform spin density, on the length scale of resolution of the image;
   formulating a semi-empirical mathematical model I(x,y) of the spatial variation in RF signal intensity within the said object;
   fitting said model to selected measured RF signal intensities of said surrounding medium to obtain an estimate of the spatial variation of magnetic resonance imaging radiofrequency (RF) signal intensities within said object; and,
   rescaling the initial MRI image by dividing the signal intensities of the image of the object.

* * * * *

UNITED STATES PATENT AND TRADEMARK OFFICE
CERTIFICATE OF CORRECTION

PATENT NO. : 7,053,612 B2 Page 1 of 1
APPLICATION NO. : 10/820727
DATED : May 30, 2006
INVENTOR(S) : Tim St. Pierre It is certified that error appears in the above-identified patent and that said Letters Patent is hereby corrected as shown below:

Col. 12, line 63:      Replace "RE" with --RF--.

Col. 12, line 64:      Replace "RE" with --RF--.

Col. 13, lines 56, 58-59: Replace "RE" with --RF--.

Col. 14, line 7:       Replace "RE" with --RF--.

Signed and Sealed this

Twentieth Day of February, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,053,612 B2 | Page 1 of 1 |
| APPLICATION NO. | : 10/820727 | |
| DATED | : May 30, 2006 | |
| INVENTOR(S) | : Tim St. Pierre | |

It is certified that error appears in the above-identified patent and that said Letters Patent is hereby corrected as shown below:

Col. 12, lines 59 and 63:   Replace "RE" with --RF--.

Col. 12, line 64:   Replace "RE" with --RF--.

Col. 13, lines 56, 58-59:   Replace "RE" with --RF--.

Col. 14, line 7:   Replace "RE" with --RF--.

This certificate supersedes the Certificate of Correction issued February 20, 2007.

Signed and Sealed this

Sixth Day of May, 2008

JON W. DUDAS
*Director of the United States Patent and Trademark Office*